United States Patent
Lee et al.

(10) Patent No.: US 9,110,100 B2
(45) Date of Patent: Aug. 18, 2015

(54) CIRCUIT MODULE AND BATTERY PACK INCLUDING THE SAME

(75) Inventors: Tae-Jong Lee, Yongin-si (KR); Ben Lim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 556 days.

(21) Appl. No.: 13/335,875

(22) Filed: Dec. 22, 2011

(65) Prior Publication Data

US 2012/0262123 A1   Oct. 18, 2012

(30) Foreign Application Priority Data

Apr. 14, 2011   (KR) .................. 10-2011-0034755

(51) Int. Cl.
| | | |
|---|---|---|
| *H02J 7/00* | (2006.01) | |
| *H05K 5/00* | (2006.01) | |
| *H05K 1/18* | (2006.01) | |
| *G01R 1/20* | (2006.01) | |
| *G01R 31/36* | (2006.01) | |
| *H01C 3/12* | (2006.01) | |

(52) U.S. Cl.
CPC .............. *G01R 1/20* (2013.01); *G01R 31/3606* (2013.01); *H01C 3/12* (2013.01); *H02J 7/007* (2013.01)

(58) Field of Classification Search
CPC ...................................................... G01R 1/203
USPC ................. 320/112, 128, 132, 134, 150, 152, 320/162–164; 257/503, 750; 361/736, 748, 361/749, 753, 761, 762
See application file for complete search history.

(56) References Cited

U.S. PATENT DOCUMENTS

| | | | |
|---|---|---|---|
| 6,163,132 A | 12/2000 | Higuchi et al. | |
| 6,542,379 B1* | 4/2003 | Lauffer et al. | ................ 361/793 |
| 6,707,682 B2* | 3/2004 | Akiba et al. | ................... 361/763 |
| 7,683,604 B1* | 3/2010 | Steele et al. | ............. 324/123 R |
| 7,737,660 B2 | 6/2010 | Yun | |
| 7,742,314 B2* | 6/2010 | Urashima et al. | ............. 361/793 |
| 2004/0195654 A1* | 10/2004 | Clevenger et al. | ............ 257/535 |
| 2009/0087725 A1* | 4/2009 | Sim | ................................ 429/90 |

FOREIGN PATENT DOCUMENTS

| | | |
|---|---|---|
| KR | 10-2004-0014545 A | 2/2004 |
| KR | 10-0570452 | 4/2006 |
| KR | 10-2008-0018468 | 2/2008 |
| KR | 10-2009-0032612 A | 4/2009 |
| KR | 10-0902684 | 6/2009 |

OTHER PUBLICATIONS

English Translation of KIPO Office action dated Jun. 11, 2012 for priority Application No. 102011-0034755 (8 pages), previously cited on Jul. 20, 2012.

* cited by examiner

*Primary Examiner* — Richard V Muralidar
(74) *Attorney, Agent, or Firm* — Christie, Parker & Hale, LLP

(57) ABSTRACT

A circuit module of a battery pack includes a pattern resistor having conductivity; a temperature sensor that is adjacent to the pattern resistor and that senses a temperature of the pattern resistor; and a current detecting unit that is electrically connected to both ends of the pattern resistor, that is electrically connected to the temperature sensor, and that detects a current flowing in the pattern resistor based on a voltage across the ends of the pattern resistor and a temperature of the pattern resistor.

16 Claims, 3 Drawing Sheets

CIRCUIT MODULE AND BATTERY PACK INCLUDING THE SAME

CROSS-REFERENCE TO RELATED APPLICATION

This application claims priority to and the benefit of Korean Patent Application No. 10-2011-0034755, filed on Apr. 14, 2011, in the Korean Intellectual Property Office, the disclosure of which is incorporated herein in its entirety by reference.

BACKGROUND

1. Field

Aspects of embodiments according to the present invention relate to a circuit module and a battery pack including the circuit module.

2. Description of the Related Art

Due to the development of wireless Internet or communication technologies, a supply of portable electronic devices that can be powered by a battery, without a power supply unit, has sharply increased. In order for the portable electronic devices to be used in various places without regard to the power supply unit, the portable electronic devices may include a battery pack. In this regard, the battery pack may include a battery cell that may be repeatedly charged and discharged.

The battery pack may include a circuit for improving stability of the battery pack by blocking or stopping over-current and over-charging, or for controlling charging and discharging of the battery pack by detecting a current of the battery pack. The current of the battery pack is a factor for not only checking charging and discharging, but also for checking deterioration and lifetime of the battery pack, and thus it is desirable to detect an exact or accurate value.

SUMMARY

Aspects of embodiments according to the present invention are directed toward a circuit module capable of accurately or exactly detecting a current of a battery pack, and a battery pack including the circuit module.

Additional aspects will be set forth in part in the description which follows and, in part, will be apparent from the description, or may be learned by practice of the presented embodiments.

According to one or more embodiments of the present invention, a circuit module includes a pattern resistor having conductivity; and a current detecting unit electrically connected to both ends of the pattern resistor, and for detecting a current flowing in the pattern resistor based on a voltage across the ends of the pattern resistor and a temperature of the pattern resistor.

The pattern resistor may be on a circuit layer of a printed circuit board (PCB) including multiple layers, and the pattern resistor may be adjacent to a ground having a larger area than the pattern resistor and including a metal material.

The circuit layer may be on an intermediate layer from among the multiple layers of the PCB.

The pattern resistor may have a serpentine shape.

The pattern resistor may include copper.

The circuit module may further include a temperature sensor electrically connected to the current detecting unit and being adjacent to the pattern resistor so as to sense the temperature of the pattern resistor.

The current detecting unit may be configured to measure the voltage across the ends of the pattern resistor, to compensate for a resistance value of the pattern resistor in accordance with the temperature input from the temperature sensor, and to calculate the voltage and the compensated resistance value, whereby the current detecting unit may detect the current flowing in the pattern resistor.

According to one or more embodiments of the present invention, a battery pack includes a battery cell; and a protective circuit module electrically connected with the battery cell, wherein the protective circuit module includes a pattern resistor having conductivity; and a current detecting unit electrically connected to both ends of the pattern resistor and for detecting a charging current or a discharging current flowing in the pattern resistor based on a voltage across the ends of the pattern resistor and a temperature of the pattern resistor.

The pattern resistor may be on a circuit layer of a printed circuit board (PCB) including multiple layers, and may be adjacent to a ground formed on the circuit layer.

The ground may have a larger area than the pattern resistor.

The circuit layer may be on an intermediate layer from among the multiple layers of the PCB.

The pattern resistor may have a serpentine shape.

The protective circuit module may further include a switch for controlling charging or discharging of the battery cell.

The switch and the pattern resistor may be on a same circuit layer of the PCB including the multiple layers, and the pattern resistor may be on one side of the same circuit layer and the switch may be on the other side of the same circuit layer.

The pattern resistor may include copper.

The battery pack may further include a temperature sensor electrically connected to the current detecting unit and being adjacent to the pattern resistor so as to sense a temperature of the pattern resistor.

The current detecting unit may be configured to measure the voltage across the ends of the pattern resistor, to compensate for a resistance value of the pattern resistor in accordance with the temperature input from the temperature sensor, and to calculate the voltage and the compensated resistance value, whereby the current detecting unit may detect the current flowing in the pattern resistor.

BRIEF DESCRIPTION OF THE DRAWINGS

These and/or other aspects of the present invention will become apparent and more readily appreciated from the following description of exemplary embodiments, taken in conjunction with the accompanying drawings of which.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof. While such terms as "first," "second," etc., may be used to describe various components, such components are not to be limited to the above terms. The above terms are used only to distinguish one component from another.

Figure 1:
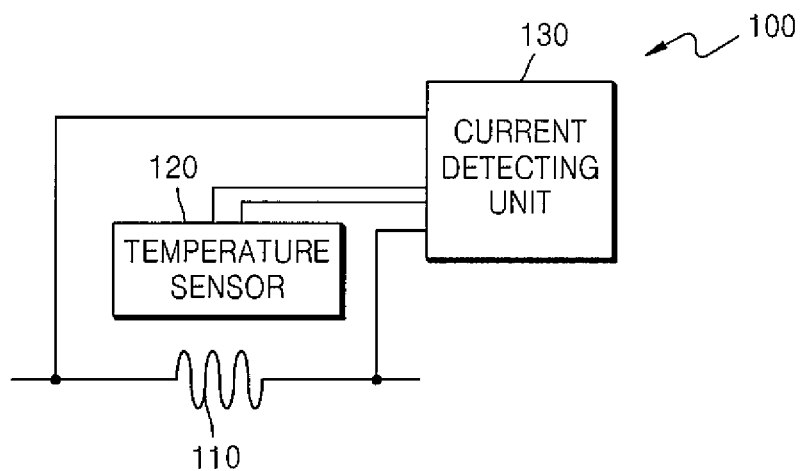
FIG. 1 is a block diagram of a circuit module according to an embodiment of the present invention.
Figure 2:
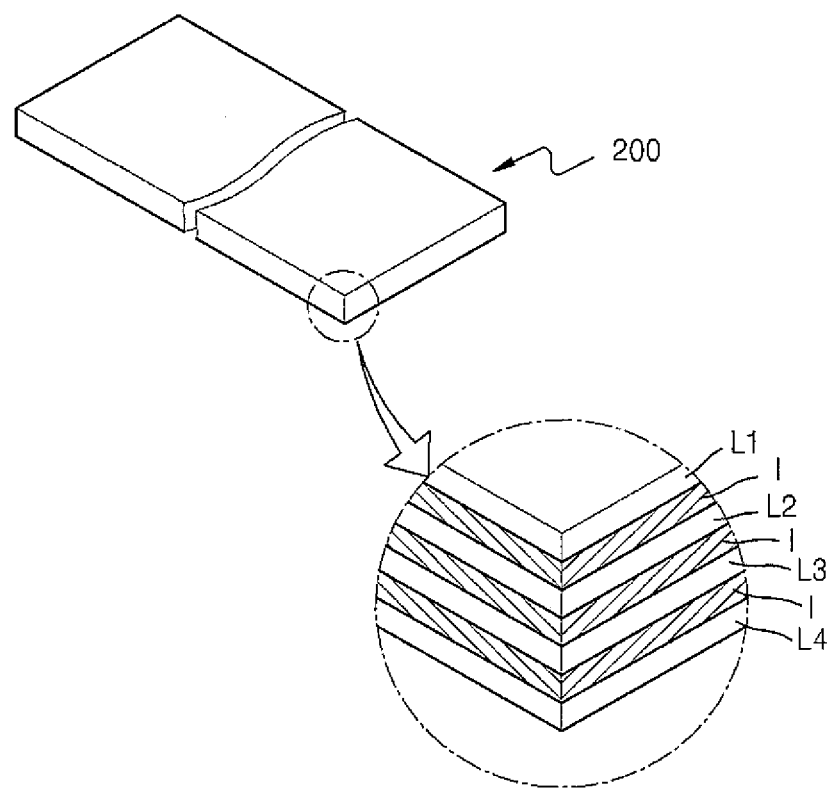
FIG. 2 is a perspective view of a printed circuit board (PCB) in which the circuit module of FIG. 1 is formed.
Figure 3:
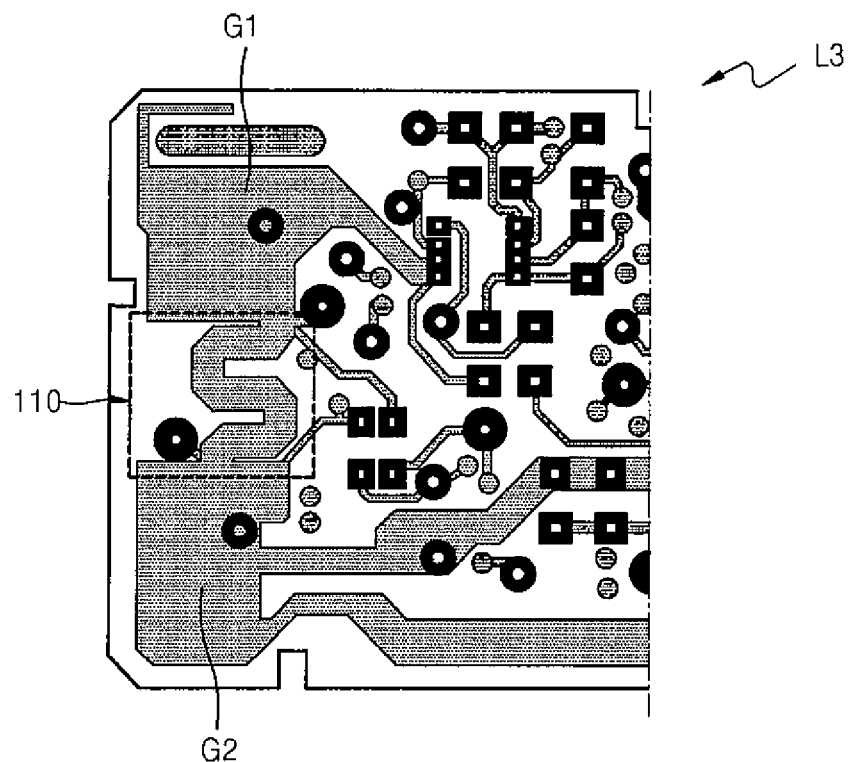
FIG. 3 is a top view illustrating a pattern resistor of FIG. 1 formed on one of circuit layers of the PCB in FIG. 2.

FIG. 1 is a block diagram of a circuit module 100 according to an embodiment of the present invention. FIG. 2 is a perspective view of a printed circuit board (PCB) 200 in which the circuit module 100 of FIG. 1 is formed. FIG. 3 is a top view illustrating a pattern resistor 110 of FIG. 1 formed on one of the circuit layers of the PCB 200 in FIG. 2.

Referring to FIG. 1, the circuit module 100 includes the pattern resistor 110, a temperature sensor 120 for sensing a temperature change of the pattern resistor 110, and a current detecting unit 130 for detecting a current flowing in the pattern resistor 110.

The pattern resistor 110 includes a conductive material in which the current may flow. For example, the pattern resistor 110 may include copper. Also, the pattern resistor 110 may include nickel, or an alloy of nickel and copper. Both ends of the pattern resistor 110 are electrically connected to the current detecting unit 130 so as to detect the current flowing in the pattern resistor 110.

For example, in a case where the circuit module 100 is used in a battery pack, the pattern resistor 110 may be used to detect charging and discharging current of the battery pack. For example, the current flowing in the pattern resistor 110 is a high current that flows while the battery pack is charged or discharged. In order to accurately or exactly detect the high current, it is necessary to accurately or exactly detect a voltage across the ends or terminals of the pattern resistor 110, and a resistance value of the pattern resistor 110.

For example, a rate of change of resistance of the pattern resistor 110 including copper may be highly increased according to an increase of temperature. Thus, in order to accurately or exactly detect the current flowing in the pattern resistor 110 based on the voltage across the ends of the pattern resistor 110 and the resistance value of the pattern resistor 110, a change of the resistance value of the pattern resistor 110 due to a temperature change is compensated for.

The temperature sensor 120 is adjacent to the pattern resistor 110, so that the temperature sensor 120 may detect or sense a temperature of the pattern resistor 110. The temperature sensor 120 may be formed as a thermistor, an integrated circuit (IC) temperature sensor, or the like. The temperature detected by the temperature sensor 120 is output to the current detecting unit 130.

The current detecting unit 130 is electrically connected to the ends of the pattern resistor 110 so as to measure the voltage across the ends of the pattern resistor 110. Also, the current detecting unit 130 compensates for the resistance value of the pattern resistor 110 based on the temperature input from the temperature sensor 120. For example, a look-up table with respect to a temperature change and resistance values of the pattern resistor 110 may be previously stored in the current detecting unit 130, and the current detecting unit 130 may compensate for the resistance value of the pattern resistor 110 based on the look-up table. Alternatively, the current detecting unit 130 may compensate for the resistance value of the pattern resistor 110 by performing a calculation by using a set or predetermined equation with respect to a temperature change and resistance values of a pattern resistor. The current detecting unit 130 may detect the current flowing in the pattern resistor 110 based on both the resistance value of the pattern resistor 110 and the voltage across the ends of the pattern resistor 110.

Referring to FIGS. 2 and 3, the circuit module 100 of FIG. 1 may be formed in the PCB 200. The PCB 200 has a multi-layer structure including a plurality of circuit layers L1, L2, L3, and L4, and insulating layers 1 interposed therebetween. The circuit layers L1, L2, L3, and L4 of the PCB 200 may be electrically connected to each other via inner via holes (not shown). The circuit module 100 of FIG. 1 may be formed in the circuit layer L3, and various devices that are electrically connected to positive and negative electrodes of a battery cell or that are arranged to protect the battery pack, may be mounted on the rest of the circuit layers L1, L2, and L4.

The pattern resistor 110 may be formed to have a set or predetermined pattern in the circuit layer L3. For example, the pattern resistor 110 may be printed in a serpentine shape. In general, when a length of a resistor is increased, a resistance value is also increased. Thus, by forming the pattern resistor 110 in the serpentine shape, the pattern resistor 110 may have a resistance value sufficient to allow the current detecting unit 130 to detect the current flowing in the pattern resistor 110, and the pattern resistor 110 may occupy only a small space of the PCB 200. By significantly decreasing the space occupied by the pattern resistor 110, a space in which other components are mounted may be secured, and a size of the circuit module 100 may be decreased.

The pattern resistor 110 may be formed on the circuit layer L3 of the PCB 200 having multiple layers, wherein grounds G1 and G2 are arranged on the circuit layer L3. The grounds G1 and G2 may include a metal material and may be printed on the circuit layer L3. For example, the grounds G1 and G2 may include copper.

The grounds G1 and G2 may be adjacent to the pattern resistor 110 and may have an area relatively larger than an area of the pattern resistor 110. The grounds G1 and G2 may function to absorb heat generated in the pattern resistor 110 and to radiate the heat. Thus, although a temperature of the pattern resistor 110 sharply increases, the heat generated in the pattern resistor 110 may be externally radiated via the grounds G1 and G2.

In a case where the circuit module 100 is used in the battery pack, the ground G1 disposed at one side of the pattern resistor 110 may be electrically connected to a ground of the battery pack, and the ground G2 disposed at the other side of the pattern resistor 110 may be electrically connected to a ground of the battery cell.

Although it is not illustrated, the grounds G1 and G2 may be formed on an uppermost or lowermost layer of the PCB 200. For example, in a case where the grounds G1 and G2 are formed on the circuit layer L1 (the uppermost layer) or the circuit layer L4 (the lowermost layer) of the PCB 200, the grounds G1 and G2, and other devices (not shown) for protecting the battery pack, or a connector may be arranged.

In another embodiment, the grounds G1 and G2 may be formed on an intermediate layer of the PCB 200. When the grounds G1 and G2 are formed on the intermediate layer of the PCB 200, e.g., the third circuit layer L3, unlike the previous embodiment, it is not necessary to mount other components, so that an area of the grounds G1 and G2 may be maximally increased. Since the area of the grounds G1 and G2 is increased, a heat radiation effect of the pattern resistor 110 via the grounds G1 and G2 may also be increased.

Figure 4:
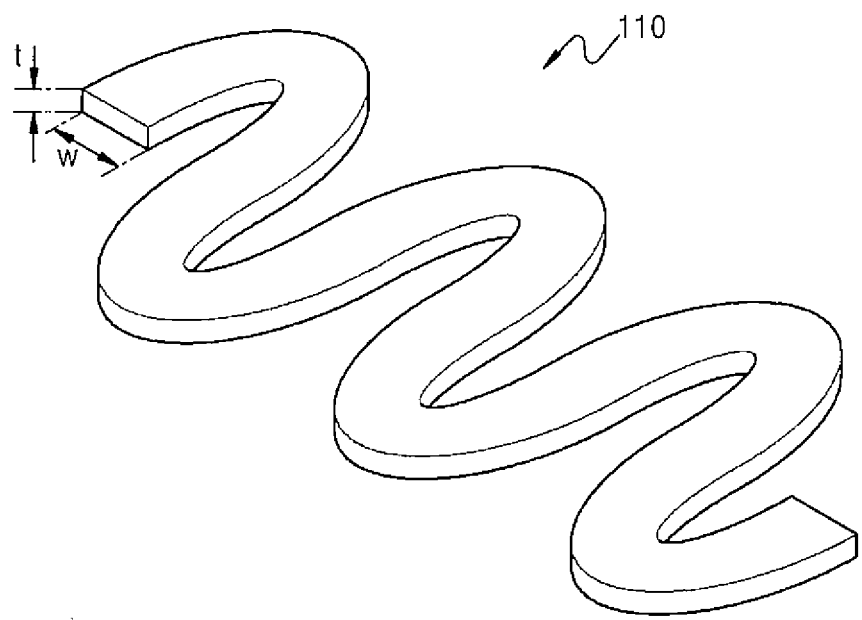
FIG. 4 is a perspective view of the pattern resistor, according to an embodiment of the present invention.

FIG. 4 is a perspective view of the pattern resistor 110, according to an embodiment of the present invention.

Referring to FIG. 4, a cross-section of the pattern resistor 110 may be quadrangular and the pattern resistor 110 may have a serpentine shape. A width (w) of the pattern resistor 110 may be between about 0.8 mm and about 1.2 mm, and a thickness (t) of the pattern resistor 110 may be between about 28.5 μm and about 31.5 μm. A cross-sectional area of the pattern resistor 110 may be between about $27 \times 10^{-9}$ m$^2$ and about $33 \times 10^{-9}$ m$^2$. By allowing the thickness t of the pattern resistor 110 to be smaller than the width w, a total thickness of the circuit module 100 having the pattern resistor 110 formed therein may be decreased (e.g., minimally decreased). A length of the pattern resistor 110 may be about 10 mm.

Figure 5:
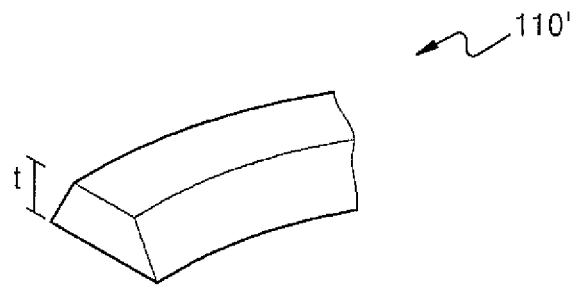
FIG. 5 illustrates a portion of a pattern resistor, according to another embodiment of the present invention.

FIG. 5 illustrates a portion of a pattern resistor 110', according to another embodiment of the present invention.

Referring to FIG. 5, a cross-section of the pattern resistor 110' may have a trapezoid shape. The pattern resistor 110' may be formed in a serpentine shape, and thus may occupy less space on the PCB 200. In the present embodiment, a cross-sectional area of the pattern resistor 110' may be between about $27 \times 10^{-9}$ m$^2$ and about $33 \times 10^{-9}$ m$^2$, and a thickness (t) of the pattern resistor 110' may be between about 28.5 μm and about 31.5 μm.

In another embodiment, a cross-section of a pattern resistor may have a polygonal shape such as triangular, pentagonal, hexagonal and the like, or may be oval or circular.

Figure 6:
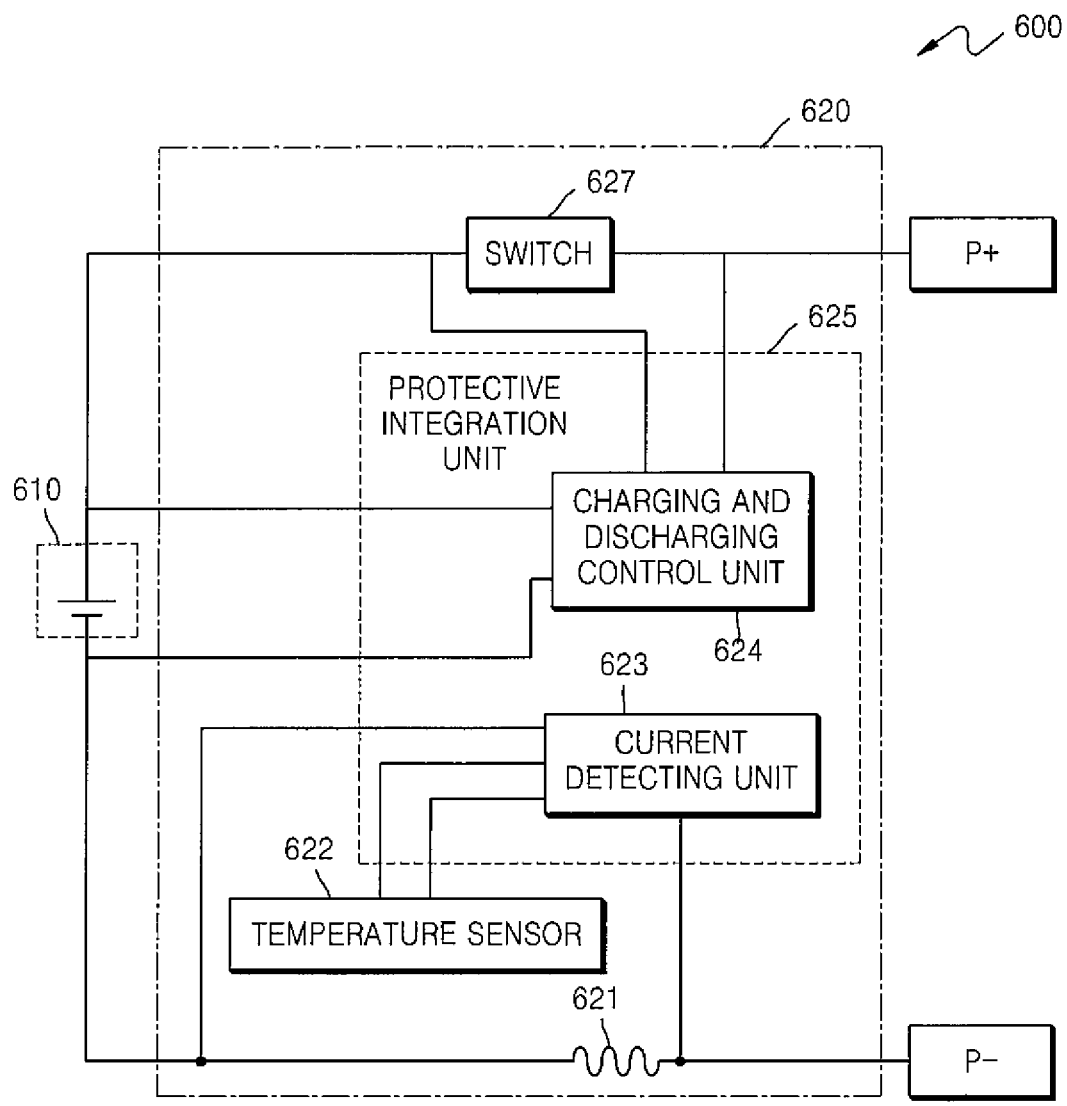
FIG. 6 is a block diagram illustrating a circuit configuration of a battery pack, according to an embodiment of the present invention.

FIG. 6 is a block diagram illustrating a circuit configuration of a battery pack 600, according to an embodiment of the present invention. Referring to FIG. 6, the battery pack 600 includes a battery cell 610 and a protective circuit module 620.

Although it is not illustrated, the battery cell 610 may include an electrode assembly formed by sequentially stacking a positive electrode plate, a separator, and a negative electrode plate. In order to provide the battery pack 600 having a high output and high capacity, the electrode assembly may have a structure in which a plurality of layers are stacked, or may be wound in the shape of a jelly roll.

Referring to FIG. 6, the protective circuit module 620 may be electrically connected to the battery cell 610, and may include a pattern resistor 621, a temperature sensor 622 for sensing a temperature of the pattern resistor 621, a switch 627 for controlling charging and discharging, and a protective integration unit 625 for controlling the protective circuit module 620.

The pattern resistor 621 may be disposed on a high current path so as to detect the high current that flows when the battery pack 600 is charged or discharged. The detailed descriptions regarding the pattern resistor 621 and the temperature sensor 622 are substantially the same as the embodiments described with reference to FIGS. 1 through 5.

The switch 627 may be electrically connected to the high current path, thereby switching on/off of charging and discharging paths. The switch 627 may include two switching devices (not shown). One of the two switching devices may switch on the charging path, and the other one of the two switching devices may switch off the discharging path. For example, when the one of the two switching devices for charging is switched on, the other one of the two switching devices is switched off, and when the other one of the two switching devices for discharging is switched on, the one of the two switching devices is switched off. The switch 627 may include an N-type or P-type field effect transistor.

When the other one of the two switching devices for discharging is switched on, the battery pack 600 may provide a power to an external device (not shown) that is electrically connected to terminals P+ and P−, and when the one of the two switching devices for charging operation is switched on, the battery pack 600 may receive a power from a charger (not shown) that is electrically connected to the terminals P+ and P−.

The protective integration unit 625 may include a current detecting unit 623 and a charging and discharging control unit 624.

The current detecting unit 623 is electrically connected to both ends of the pattern resistor 621, thereby measuring a voltage across the ends of the pattern resistor 621, and compensating for a resistance value of the pattern resistor 621 based on a temperature input from the temperature sensor 622. The current detecting unit 623 may detect a current flowing in the pattern resistor 621, based on the compensated resistance value and the measured voltage of the pattern resistor 621. As described above, the compensation of the resistance value of the pattern resistor 621 is achieved by performing calculation by using a previously stored look-up table with respect to temperatures and resistance values, or by using a predetermined equation with respect to temperatures and resistance values.

The charging and discharging control unit 624 may determine charging capacity or discharging capacity based on the high current detected by the current detecting unit 623. For example, when the battery pack 600 is charged, the charging and discharging control unit 624 may determine the charging capacity by continuously calculating a voltage of the battery cell 610 and a charging current value of the battery cell 610; and when the battery pack 600 is discharged, the charging and discharging control unit 624 may determine the discharging capacity by continuously calculating the voltage of the battery cell 610 and a discharging current value of the battery cell 610.

In a similar manner to those described with reference to FIGS. 2 and 3, the pattern resistor 621, the temperature sensor 622, the protective integration unit 625 including the current detecting unit 623 and the charging and discharging control unit 624, and the switch 627 may be arranged on the same circuit layer of a PCB having multiple layers.

When the current detecting unit 623 detects a current, the current detecting unit 623 compensates for a temperature change in the pattern resistor 621. If a device other than the pattern resistor 621 affects the temperature sensor 622, it is difficult to accurately or exactly compensate for the resistance value of the pattern resistor 621, so that the high current flowing in the pattern resistor 621 may not be accurately or exactly detected. In order to prevent the temperature sensor 622 from being affected by factors other than the temperature change in the pattern resistor 621, the switch 627 may be distant from the pattern resistor 621. For example, when the pattern resistor 621 is arranged on one side of a circuit layer of a PCB having multiple layers, the switch 627 may be arranged on the other side or the opposite side of the circuit layer.

The circuit module 100 and the battery pack 600 including the circuit module 100 according to the one or more embodiments of the present invention may accurately or exactly detect the current flowing in the pattern resistors 110 and 621 by using the pattern resistors 110 and 621, and the temperature sensors 120 and 622. Also, since the pattern resistors 110 and 621 are formed by using copper that is inexpensive, the manufacturing costs may be reduced.

In addition, the pattern resistors 110 and 621 according to the embodiments of the present invention are formed to have a small thickness by using a printing method or the like, so that the pattern resistors 110 and 621 occupy a small space, compared to a sense resistor occupying a relatively large space. Thus, a size of the circuit module 100 or a size of the protective circuit module 620 may be decreased.

According to the one or more embodiments of the present invention, current flowing in the pattern resistor may be accurately or exactly detected, and charging capacity of the battery pack may be accurately or exactly controlled.

Also, according to the one or more embodiments of the present invention, a circuit is configured by using the pattern resistor including a conductive material, so that the size of the protective circuit module may be decreased, and the manufacturing costs may be reduced.

It should be understood that the exemplary embodiments described therein should be considered in a descriptive sense only and not for purposes of limitation. Descriptions of features or aspects within each embodiment should typically be considered as available for other similar features or aspects in other embodiments.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A circuit module comprising:
   a pattern resistor having conductivity;
   a current detecting unit electrically connected to both ends of the pattern resistor, and for detecting a current flowing in the pattern resistor based on a voltage across the ends of the pattern resistor and a temperature of the pattern resistor; and
   a ground comprising a metal material and having a larger area than the pattern resistor,
   wherein the pattern resistor is adjacent to the ground, and the pattern resistor is at a same layer as the ground.

2. The circuit module of claim 1, wherein the pattern resistor is at a circuit layer of a printed circuit board (PCB) comprising multiple layers.

3. The circuit module of claim 2, wherein the circuit layer is at an intermediate layer from among the multiple layers of the PCB.

4. The circuit module of claim 1, wherein the pattern resistor has a serpentine shape.

5. The circuit module of claim 1, wherein the pattern resistor comprises copper.

6. The circuit module of claim 1, further comprising a temperature sensor electrically connected to the current detecting unit and being adjacent to the pattern resistor so as to sense the temperature of the pattern resistor.

7. The circuit module of claim 6, wherein the current detecting unit is configured to measure the voltage across the ends of the pattern resistor, to compensate for a resistance value of the pattern resistor in accordance with the temperature input from the temperature sensor, and to calculate the voltage and the compensated resistance value, whereby the current detecting unit detects the current flowing in the pattern resistor.

8. A battery pack comprising:
   a battery cell; and
   a protective circuit module electrically connected with the battery cell,
   wherein the protective circuit module comprises:
      a pattern resistor having conductivity;
      a current detecting unit electrically connected to both ends of the pattern resistor and for detecting a charging current or a discharging current flowing in the pattern resistor based on a voltage across the ends of the pattern resistor and a temperature of the pattern resistor; and
      a ground comprising a metal material and having a larger area than the pattern resistor,
   wherein the pattern resistor is adjacent to the ground at a circuit layer and the pattern resistor is at the circuit layer with the ground.

9. The battery pack of claim 8, wherein the pattern resistor is at a circuit layer of a printed circuit board (PCB) comprising multiple layers.

10. The battery pack of claim 9, wherein the circuit layer is at an intermediate layer from among the multiple layers of the PCB.

11. The battery pack of claim 8, wherein the pattern resistor has a serpentine shape.

12. The battery pack of claim 8, wherein the protective circuit module further comprises a switch for controlling charging or discharging of the battery cell.

13. The battery pack of claim 12, wherein the switch and the pattern resistor are at the same circuit layer of the PCB comprising the multiple layers, and
   the pattern resistor is on one side of the same circuit layer, and the switch is arranged on the other side of the same circuit layer.

14. The battery pack of claim 8, wherein the pattern resistor comprises copper.

15. The battery pack of claim 8, further comprising a temperature sensor electrically connected to the current detecting unit and being adjacent to the pattern resistor so as to sense the temperature of the pattern resistor.

16. The battery pack of claim 15, wherein the current detecting unit is configured to measure the voltage across the ends of the pattern resistor, to compensate for a resistance value of the pattern resistor in accordance with the temperature input from the temperature sensor, and to calculate the voltage and the compensated resistance value, whereby the current detecting unit detects the current flowing in the pattern resistor.

* * * * *